United States Patent
Takagaki et al.

(10) Patent No.: US 9,894,763 B2
(45) Date of Patent: *Feb. 13, 2018

(54) INSULATING SUBSTRATES INCLUDING THROUGH HOLES

(71) Applicant: NGK INSULATORS, LTD., Aichi-prefecture (JP)

(72) Inventors: Tatsuro Takagaki, Nagoya (JP); Yasunori Iwasaki, Kitanagoya (JP); Sugio Miyazawa, Kasugai (JP); Akiyoshi Ide, Kasugai (JP); Hirokazu Nakanishi, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/827,456

(22) Filed: Aug. 17, 2015

(65) Prior Publication Data

US 2015/0353428 A1 Dec. 10, 2015

Related U.S. Application Data

(63) Continuation of application No. PCT/JP2015/055258, filed on Feb. 24, 2015.

(30) Foreign Application Priority Data

Feb. 26, 2014 (JP) ................................. 2014-035399

(51) Int. Cl.
*H05K 1/03* (2006.01)
*H05K 1/11* (2006.01)
(Continued)

(52) U.S. Cl.
CPC ............ *H05K 1/115* (2013.01); *C04B 35/111* (2013.01); *C04B 35/119* (2013.01);
(Continued)

(58) Field of Classification Search
CPC ....................................................... H05K 1/115
See application file for complete search history.

(56) References Cited

U.S. PATENT DOCUMENTS

| | | | | |
|---|---|---|---|---|
| 6,362,120 | B1 * | 3/2002 | Fukushima | ........... C04B 35/111 501/127 |
| 8,421,546 | B2 | 4/2013 | Sugama et al. | |

(Continued)

FOREIGN PATENT DOCUMENTS

| | | |
|---|---|---|
| JP | 62-260766 A | 11/1987 |
| JP | 2-205094 A | 8/1990 |

(Continued)

OTHER PUBLICATIONS

International Search Report and Written Opinion for PCT Patent App. No. PCT/JP2015/055258 (dated May 26, 2015) and English language translation of the relevant parts.

(Continued)

*Primary Examiner* — William P Watkins, III
(74) *Attorney, Agent, or Firm* — Cermak Nakajima & McGowan LLP; Tomoko Nakajima

(57) ABSTRACT

It is provided an insulating substrate including through holes 2 for conductors arranged in the insulating substrate. A thickness of the insulating substrate is 25 to 300 μm, and a diameter of the through hole is 20 to 100 μm. The insulating substrate is composed of an alumina sintered body. A relative density and an average grain size of the alumina sintered body is 99.5 percent or higher and 2 to 50 μm, respectively.

4 Claims, 4 Drawing Sheets

(51) Int. Cl.
　　*C04B 35/119*　　(2006.01)
　　*H01B 3/12*　　(2006.01)
　　*C04B 35/111*　　(2006.01)
　　*H05K 3/00*　　(2006.01)
　　*H01B 17/56*　　(2006.01)
　　*C04B 35/634*　　(2006.01)

(52) U.S. Cl.
　　CPC .............. *C04B 35/634* (2013.01); *H01B 3/12* (2013.01); *H01B 17/56* (2013.01); *H05K 1/03* (2013.01); *H05K 1/0306* (2013.01); *H05K 3/00* (2013.01); *H05K 3/0029* (2013.01); *C04B 2235/3206* (2013.01); *C04B 2235/3217* (2013.01); *C04B 2235/3225* (2013.01); *C04B 2235/3244* (2013.01); *C04B 2235/3281* (2013.01); *C04B 2235/3418* (2013.01); *C04B 2235/606* (2013.01); *C04B 2235/6023* (2013.01); *C04B 2235/612* (2013.01); *C04B 2235/6582* (2013.01); *C04B 2235/662* (2013.01); *C04B 2235/72* (2013.01); *C04B 2235/77* (2013.01); *C04B 2235/786* (2013.01); *C04B 2235/95* (2013.01); *H05K 3/0014* (2013.01); *H05K 2201/09009* (2013.01); *Y10T 428/24273* (2015.01)

(56) References Cited

U.S. PATENT DOCUMENTS

| | | |
|---|---|---|
| 8,829,355 B2 | 9/2014 | Kariya et al. |
| 9,538,653 B2* | 1/2017 | Takagaki .............. C04B 35/111 |
| 2010/0229813 A1* | 9/2010 | Ogata .................. C04B 35/111 |
| | | 123/146.5 R |

FOREIGN PATENT DOCUMENTS

| | | |
|---|---|---|
| JP | 5-67026 U | 9/1993 |
| JP | 2001-097767 A | 4/2001 |
| JP | 2001-156458 A | 6/2001 |
| JP | 2008-288403 A | 11/2008 |
| JP | 2009-105326 A | 5/2009 |
| JP | 2010-232636 A | 10/2010 |
| JP | 5065494 B2 | 8/2012 |
| JP | 3183661 U | 5/2013 |

OTHER PUBLICATIONS

International Preliminary Examination Report for PCT Patent App. No. PCT/JP2015/055258 (dated Sep. 9, 2016).
Extended European Search Report for European Patent App. No. 15750613.0 (Sep. 22, 2017).

* cited by examiner

Unit length of straight line (for example 500 μm)

Number of grains = 22, 23, 19
(at different three positions)

INSULATING SUBSTRATES INCLUDING THROUGH HOLES

FIELD OF THE INVENTION

The present invention relates to a ceramic substrate including many through holes for providing via conductors or through hole conductors.

BACKGROUND ARTS

When electronic devices, such as IC devices, are mounted, it is necessary to form conducting wirings through a semiconductor supporting substrate. As a method of forming conductor wirings in such supporting substrate, it is performed to form many through holes in the supporting substrate and to form a metal electrode on a side wall face of the through hole. As to a diameter of the through hole, it is demanded reduction of a size of the hole to 100 μm or smaller, for example, and it is further demanded to form many holes at a high density. Further, as a material of the supporting substrate, a high resistance is required for suppressing leak current between the wirings.

Further, as it is demanded to make such substrate thinner for attending the need of reducing the heights of electronic devices, a high strength is required for the material of the substrate, On the other hand, since the substrate is divided into individual pieces by dicing after mounting electronic devices thereon, properties such as ease of cutting is also demanded.

It is known to form through holes in a high resistance silicon substrate. In this case, photolithography and DRIE are combined to form the through holes.

In the case that higher dielectric strength voltage is required for an insulating substrate, a sapphire substrate is used. In this case, laser processing technique is generally used. In this case, however, due to the influences during the laser processing or deterioration of a substrate strength in the case of forming many holes, the sapphire substrate itself may be broken. Particularly, it is considered that the yield is lowered as the density of the through holes becomes higher.

According to patent documents 1 and 2, it is described that through hole electrodes are formed in a wafer made of a ceramics such as alumina. It is further described that through holes are formed in the wafer by laser processing.

According to patent documents 3, through holes are formed in a ceramic substrate and the through holes are formed in a green sheet for the ceramic substrate by pins. According to patent document 4, it is also described that the through electrodes are formed in the ceramic substrate.

Further, according to patent document 5, laser is irradiated to a green sheet of a ceramic substrate such as alumina to form through holes each having a diameter of 100 μm or smaller.

PRIOR DOCUMENTS

Patent Documents (Patent document 1) Japanese utility model publication No. H05-067026A
(Patent document 2) Japanese patent publication No. 2010-232636A
(Patent document 3) Japanese patent No. 5065494B
(Patent document 4) Japanese patent publication No. 2009-105326A
(Patent document 5) Japanese patent publication No. 2008-288403A

SUMMARY OF THE INVENTION

An insulating substrate made of an alumina sintered body has a high toughness so that a sufficiently high substrate strength can generally be assured. However, as the inventors tried to form many through holes in the insulating substrate of the alumina sintered body at a high density, it was actually found that through holes having abnormal shape are generated to lower the production yield. In the case that such through holes with abnormal shape are generated and that a high temperature is exerted during the subsequent electrode-formation and semiconductor processing steps, it might result in fractures and cracks or conduction failure. Particularly, as the ceramic substrate becomes thinner, the influence of the abnormal shape of the through holes becomes considerable. It was further found that, as the ceramic substrate becomes thinner, the tipping and cracks tend to occur during dicing, which is problematic.

An object of the present invention is, in forming through holes in a ceramic insulating substrate, to prevent the generation of the through hole with the abnormal shape and to provide the substrate which is suitable for dicing and can be thinned.

The present invention provides an insulating substrate including through holes for conductors. The through holes are arranged in the insulating substrate. A thickness of the insulating substrate is 25 to 300 μm , a diameter of the through hole is 20 μm or larger, the insulating substrate comprises an alumina sintered body, a relative density of the alumina sintered body is 99.5 percent or higher, and an average grains size of the alumina sintered body is 2 to 50 μm.

The inventors studied the cause of the abnormal shape of the through hole in the case that many through holes are formed in an alumina substrate. For example as shown in FIG. 1(b), such through hole 2 is expanded in a single direction to form an expanded part 3.

As the shape and size of the expanded part 3 was studied, it was considered as follows. Voids, derived from coarse pores left in a dense alumina sintered body, are connected to and integrated with a relatively fine through holes 2. Such kind of void is derived from the coarse pores having a size of 10 μm or larger.

Further, as to the cause of the tipping and cracks generated during the dicing, it was considered as follows. As the substrate is ground by abrasives for dicing to generate fine ground powder, which causes clogging in spaces between the abrasives to deteriorate the performance of the grinding. Usually, as the substrate is ground, old and worn abrasives present on a surface of the abrasive stones are removed at the same time, so that new abrasives appear on the surface, maintaining the performance of the grinding. It was, however, considered that the removal of the old abrasives would be prevented due to the clogging. By observing microstructure of a ground surface of the substrate, it was proved that glass portions contained in the substrate are soft and the glass portions are gradually ground by the abrasives to generate the fine ground powder. It was found that, on the other hand, alumina portions are ground and peeled along the grain boundaries and the peeled alumina grains become ground powder as such.

It was thus considered that the generation of the fine ground powder can be prevented by reducing the glass components contained in the substrate and by making the grain size of the alumina grains larger.

Based on the findings, the inventors further studied materials of a dense alumina sintered body. As many through electrodes are formed in the substrate, it is desirable to apply a high-purity alumina sintered body for realizing a high resistance. However, at the same time, by controlling the average grain size to 2 to 50 μm and the relative density to 99.5 percent or higher, it becomes possible to prevent the coarse pores having a size of 10 μm or larger, to prevent the abnormal shape of the through hole, to prevent the generation of the fine ground powder and to prevent the tipping and cracks during the dicing due to the clogging of the abrasives. The present invention was made based on these findings.

EMBODIMENTS FOR CARRYING OUT THE INVENTION

Figure 1A:
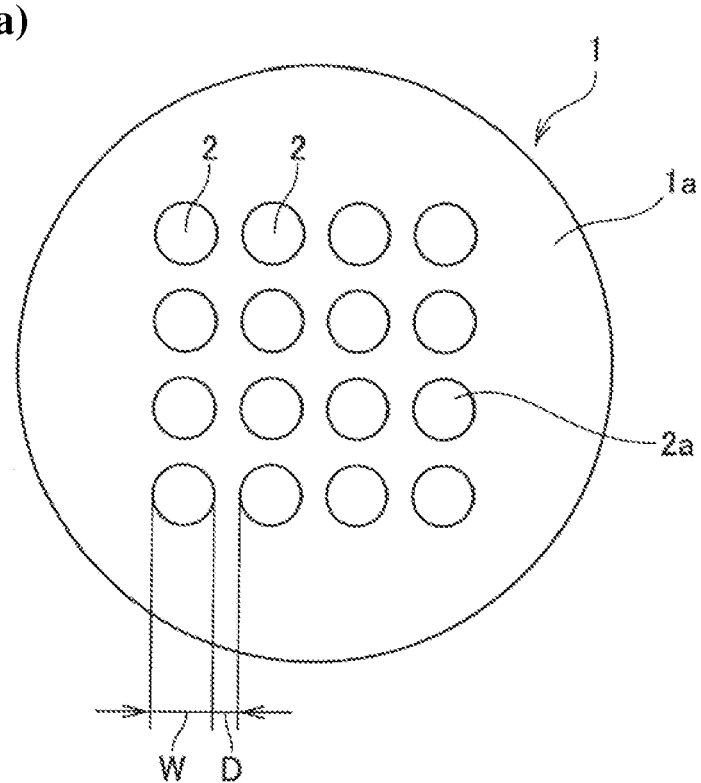
FIG. 1(a) is a plan view schematically showing an insulating substrate 1 with through holes formed therein.

The present invention will be described further in detail, referring to the drawings appropriately.

Figure 1B:
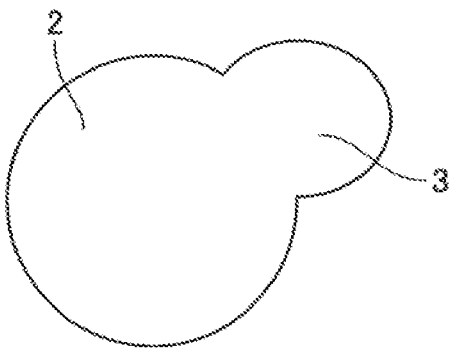
FIG. 1(b) is a schematic view showing abnormal shape of the through hole 2.
Figure 1C:
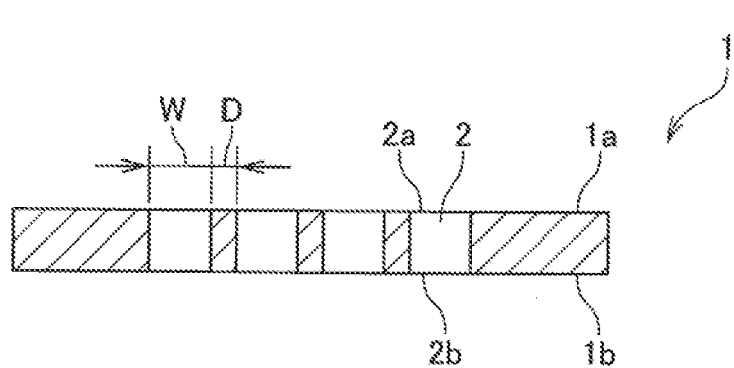
FIG. 1(c) is a cross sectional view schematically showing the insulating substrate 1 with the through holes 2 formed therein.

As shown in FIGS. 1(a) and 1(c), a first main face 1a and a second main face 1b are provided in an insulating substrate 1. It is formed many through holes 2 penetrating through the substrate between the main faces 1a and 1b.

A predetermined conductor may be formed inside of the through holes. Such conductor includes a via conductor produced by filling, into the inside of the hole, Ag, Au, Cu, Pd or the mixtures thereof or paste obtained by mixing a small amount of a glass component thereto and by firing it at 400 to 900° C. for the fixing, and a through hole conductor produced by printing a conductor only on an inner surface of the hole and by firing the conductor according to the similar process. However, the kind the conductor is not particularly limited. Further, predetermined wirings and pads are formed on the main faces 1a and 1b. Further, the insulating substrate is an integrated relay board.

In the insulating substrate of the present invention, through holes for conductors are arranged. Here, the insulating substrate has a thickness of 25 to 300 μm. On the viewpoint of reducing the height, the thickness of the insulating substrate is made 300 μm or smaller, and the thickness may preferably be 250 μm or smaller and more preferably be 200 μm or smaller. Further, on the viewpoint of a strength required for handling of the insulating substrate, the thickness of the insulating substrate is made 25 μm or larger. The thickness may preferably be 50 μm or larger and more preferably be 100 μm or larger.

A diameter W (refer to FIG. 1) of the through holes formed in the insulating substrate is 20 μm or larger. On the viewpoint of ease of the shaping, the diameter of the through hole may preferably be 25 μm or larger. Further, for increasing the density of the through holes, the diameter W of the through holes is made 100 μm or smaller and may preferably be 80 μm or smaller.

A distance D between adjacent through holes 1 may preferably be 50 μm or larger and more preferably be 100 μm or larger, on the viewpoint of preventing fracture and cracks. Further, the distance D between the adjacent through holes 2 may preferably be 1000 μm or smaller and more preferably be 500 μm or smaller, on the viewpoint of increasing the density of the through holes.

On the viewpoint of preventing the abnormal shape of the through holes as described above, the relative density of the alumina sintered body forming the insulating substrate is made 99.5 percent or higher and may preferably be made 99.6 percent or higher. Although the upper limit of the relative density is not defined, it may be 100 percent.

The relative density can be calculated from a porosity.

Relative density (%)=100(%)−porosity (%)

According to the present invention, the porosity is determined as follows.

That is, a cross section (a cross section perpendicular to the bonding face) of the handle substrate is subjected to mirror surface polishing and thermal etching to sharpen grain boundaries of the crystals, and a photograph is taken by an optical microscope (at a magnification of 200). It is then set a visual field of laminar shape, having a size of 0.1 mm in a direction of the thickness (a direction perpendicular to the bonding face) and of 1.0 mm in a direction parallel to the bonding face of the handle substrate. Then, a total area of pores having a size of 0.5 μm or larger is calculated for each visual field, and a ratio of the thus obtained area of the pores with respect to an area of the visual field is calculated, providing the porosity.

The average grain size of the alumina sintered body forming the insulating substrate is made 2 to 50 μm. By making the average grain size 50 μm or smaller, it is possible to improve the strength of the insulating substrate and to prevent the abnormal shape of the through hole. On the viewpoint, the average grains size of the alumina sintered body forming the substrate may preferably be 20 μm or smaller and most preferably be 10 μm or smaller. On the other hand, by making the average grains size 2 μm or larger, it is possible to prevent the generation of the tipping during the dicing. On the viewpoint, the average grains size may preferably be 3 μm or larger and most preferably be 3.5 μm or larger.

Here, the average grain size of the crystal grains is measured as follows.

(1) A cross section of a polycrystalline ceramic sintered body is subjected to mirror surface polishing and thermal etching to sharpen grain boundaries and a microscopic image (magnification of 100 to 200) is taken to count a number of grains through which a straight line with an unit length pass. This procedure is repeated at different three positions. Besides, the unit length is made in a range of 500 to 1000 μm.

(2) It is calculated an average of the numbers of the grains at the three positions measured.

(3) The average grain size is calculated according to the following formula.

$$D=(4/\pi)\times(L/n) \quad \text{(Calculation formula)}$$

(D: The average grain size, L: Unit length of the straight line, n: Average of the numbers of grains at the three positions)

Figure 2:
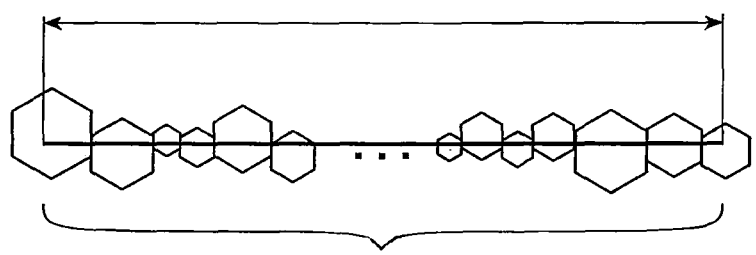
FIG. 2 is a schematic view showing an example of calculating an average grain size.

FIG. 2 shows an example of the calculation of the average grain size. It is provided that the numbers of the grains, across which the straight line of a unit length (for example 500 μm) passes, at the different three positions are 22, 23 and 19, respectively. In this case, the average grains size D is 29.9 μm, according to the calculation formula as described above;

$$D=(4/\pi)\times[500/\{(22+23+19)/3\}]=29.9 \text{ μm}.$$

According to a preferred embodiment, a purity of alumina in the alumina sintered body forming the insulating substrate is made 99.9% or higher. It is thereby possible to prevent contamination of circuits.

The purity of alumina in the alumina sintered body is decided by dissolving a sample composed of ground powder in sulfuric acid by pressurized acid decomposition to obtain dissolved solution and by analyzing the dissolved solution by ICP emission spectro-photometric analysis.

According to a preferred embodiment, to the alumina sintered body forming the insulating substrate, 200 to 800 mass ppm of zirconia, 150 to 300 mass ppm of magnesia and 10 to 30 mass ppm of yttria are added as sintering aids. By applying such construction, it becomes possible to prevent the generation of coarse bubbles to prevent the abnormal shape of the through holes and to considerably improve the breakdown voltage of the alumina sintered body as high as 50 kV/mm or higher, so that breakdown does not tend to occur even when fine through holes are formed, while assuring the purity, porosity and relative density as described above. Breakdown voltage of sapphire and conventional alumina sintered body are 47 kV/mm and 12 kV/mm, respectively. Further, a dissipation factor of the inventive alumina sintered body is comparable with that of sapphire, and is considerably lower than, for example about 1/100 of, that of the conventional alumina sintered body.

According to this embodiment, an addition amount of zirconia in the alumina sintered body forming the insulating substrate may preferably be 300 mass ppm or larger, may preferably be 600 mass ppm or smaller. Further, an addition amount of magnesia in the alumina sintered body forming the insulating substrate may preferably be 200 mass ppm or larger, and may preferably be 280 mass ppm or smaller. Further, an addition amount of yttria in the alumina sintered body forming the insulating substrate may preferably be 12 mass ppm or larger, and may preferably be 20 mass ppm or smaller.

A method of forming the through holes in the insulating substrate is not particularly limited. For example, the through holes may be formed in a green sheet of the insulating substrate by pins or laser processing. Alternatively, a blank substrate, made of the alumina sintered body, is produced and then the through holes may be formed by laser processing in the blank substrate.

Figure 3:
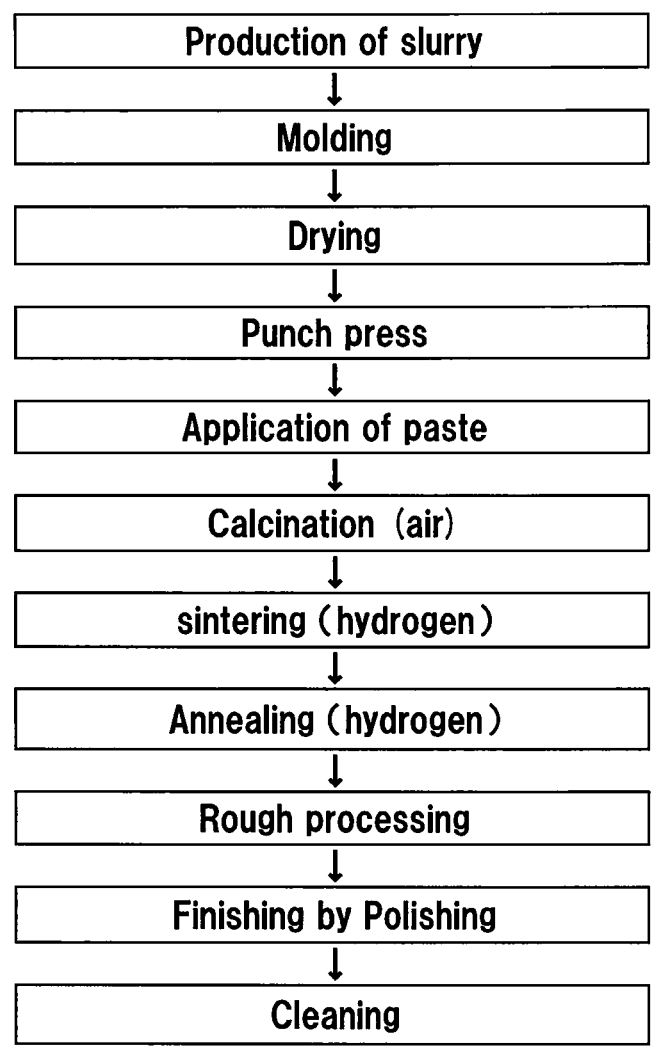
FIG. 3 is a flow chart showing an example of preferred production steps of an insulating substrate.
Figure 4:
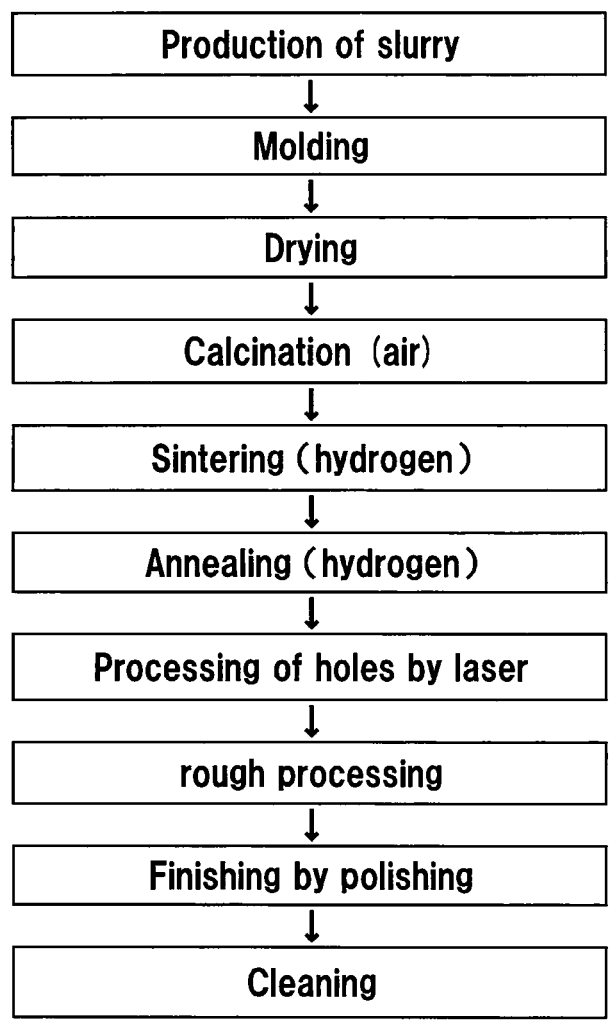
FIG. 4 is a flow chart showing an example of preferred production steps of an insulating substrate.

FIGS. 3 and 4 are flow charts for illustrating procedures suitable for producing the insulating substrates of the invention, respectively.

First, it is produced slurry for an alumina molded body.

Powder of the sintering aids, as described above, is added to high-purity alumina powder preferably having a purity of 99.9 percent or higher (more preferably 99.95 percent or higher). Such high-purity alumina powder includes high-purity alumina powder produced by Taimei Chemical Industries Corporation.

A method of molding the polycrystalline ceramic sintered body is not particularly limited, and may be an optional process such as doctor blade, extrusion, gel cast molding or the like. Most preferably, a blank substrate is produced utilizing gel cast molding.

According to a preferred embodiment, it is produced slurry containing alumina powder, powders of the sintering aids, a dispersing agent and gelling agent, and then the slurry is injected into a mold and gelled to obtain a molded body. Here, at the time of gel cast molding, a releasing agent is applied onto mold parts, the mold parts are then fabricated into the mold and the slurry is injected into the mold. Then, the gel is solidified in the mold to obtain a molded body and the molded body is released from the mold. The mold is then cleaned. The gel molded body is sintered to obtain the blank substrate.

At the time, according to the example shown in FIG. 3, many through holes are shaped in the molded body utilizing inner shape of the mold. According to the example of FIG. 4, it is not necessary to form the through holes in the molded body.

The gel molded body is then dried, preferably calcined in air and then sintered under hydrogen atmosphere. The sintering temperature during the sintering may preferably be 1700 to 1900° C. and more preferably be 1750 to 1850° C., on the viewpoint of densification of the sintered body.

Further, during the sintering, a substrate is placed on a flat plate made of a metal with a high melting point such as molybdenum. At this time, it is preferred to form a space of 5 to 10 mm over the substrate, for facilitating the discharge of the sintering aids and growth of the grains. It is because the growth of the grains results in movement of the grain boundaries so that the discharge of the sintering aids is facilitated. On the other hand, in the case that the sintering aids are discharged too much, abnormal growth of the grains tends to occur, providing the cause of cracks. It is thus more preferred that a plate of molybdenum or the like is mounted on the substrate during the annealing, so that the substrate is sandwiched between the lower and upper plates.

Further, after a sufficiently dense sintered body is generated in the sintering, an annealing process may be further performed to reduce the warping. The annealing temperature may preferably be in a range of the maximum temperature during the sintering ±100° C. and the maximum temperature may preferably be 1900° C. or lower, on the viewpoint of preventing the deformation and abnormal growth of grains and of facilitating the discharge of the sintering aids. Further, the time period of the annealing may preferably be 1 to 6 hours.

The thus obtained blank substrate is subjected to rough polishing. Then, according to the example of FIG. 3, since the molding of the through holes has been finished, precise polishing may be performed for lowering Ra of the main face. As such precise polishing, CMP(Chemical mechanical polishing) is commonly used. As the polishing slurry used therefor, it is listed slurry containing alkaline or neutral solution and abrasives with a grain size of 30 nm to 200 nm dispersed therein. As a material of the abrasive, silica, alumina, diamond, zirconia and ceria are listed, and they can be used alone or in combination. Further, as a polishing pad, solid urethane pad, non-woven cloth pad, suede pad are listed.

Further, an annealing process may preferably be performed before performing final precise polishing process and after rough polishing process. The annealing process may be performed under atmospheric gas such as air, hydrogen, nitrogen, argon or under vacuum. The temperature and time period of the annealing may preferably be made 1200 to 1600° C. and 2 to 12 hours, respectively. It is thus possible to prevent the deterioration of the flatness of the surface and to facilitate the discharge of the sintering aid.

According to the example shown in FIG. 4, the through holes are not formed in the molded body. After the blank substrate after the sintering is subjected to rough polishing, the blank substrate is then subjected to laser processing to form the through holes. The laser processing may preferably be performed as follows.

Laser beams of short pulses are irradiated onto the surface of the substrate to form the through holes. The pulse width of milli second (1/1e-3 second) or shorter is generally used.

Further, as a laser light source, gas (CO2) or solid (YAG) is used. A transfer mask is positioned in a laser system and laser beam is introduced onto the surface of the substrate, so that the through holes having desired shape can be obtained. The diameter of the hole can be adjusted by the size of the mask.

EXAMPLES

Inventive Example 1

The insulating substrate of the present invention was produced, according to the procedure described referring to FIG. 3.

Specifically, for producing the blank substrate made of translucent alumina ceramic, it was prepared slurry by mixing the following ingredients.

| (Powdery raw materials) | |
| --- | --- |
| α-alumina powder having a specific surface area of 3.5 to 4.5 m$^2$/g and an average primary particle size of 0.35 to 0.45 μm (purity of alumina was 99.9%) | 100 mass parts |
| MgO (magnesia) | 250 mass ppm |
| ZrO$_2$ (zirconia) | 400 mass ppm |
| Y$_2$O$_3$ (yttria) | 15 mass ppm |
| (Dispersing medium) | |
| Dimethyl glutarate | 27 mass parts |
| Ethylene glycol | 0.3 mass parts |
| (Gelling agent) | |
| MDI resin | 4 mass parts |
| (Dispersing agent) | |
| High molecular surfactant | 3 mass parts |
| (Catalyst) | |
| N,N-dimethylaminohexanol | 0.1 mas parts |

The slurry was cast into a mold made of an aluminum alloy at room temperature and then maintained at room temperature for 1 hour. It was then maintained at 40° C. for 30 minutes for the solidification and then released from the mold. It was further maintained at room temperature and 90° C. for 2 hours, respectively, to obtain a plate-like powder molded body. Besides, cores are provided in the mold to form many through holes.

The thus obtained powder molded body was calcined (preliminary sintering) in air at 1100° C., then sintered in atmosphere of hydrogen 3: nitrogen 1 at 1750° C., and then annealed under the same condition to produce the blank substrate.

The thus produced blank substrate was subjected to high-precision polishing. First, both faces were subjected to lapping using green carbon to adjust the shape, and the both surfaces were then subjected to lapping using diamond slurry. The diamond particle size was made 3 μm. It was finally performed CMP polishing using SiO2 abrasives and diamond abrasives and cleaning to provide the insulating substrate 1.

Characteristics of the thus obtained insulating substrate were as follows.
Breakdown voltage: average of measurement: 75 kV/mm
Thickness of insulating substrate 1: 150 μm
Diameter W of through hole 2: 60 μm
Purity of alumina: 99.9 percent
Relative density: 99.6 percent
Average grain size: 5 μm
Porosity: 0.4 percent
Resistivity: $10^{14}$ Ω·c m
Distance D between through holes: 500 μm
Number of through holes: 3.2 counts/cm$^2$
Density of pores having a size of 10 μm or larger: 0.0 percent The presence or absence of the abnormal shape was confirmed for 100 counts of the through holes in the thus obtained insulating substrate. Then, the thus obtained substrates were cut by dicing into pieces of □ 2 mm. Thereafter, the presence or absence of cracks and tipping exceeding 30 μm caused by the dicing were confirmed, and the results were shown in table 1, However, as to the dicing test, each of the ten samples was subjected to the test.
(Dicing Condition)
Rotational rate of abrasive: 30000 rpm
Feeding speed of abrasive: 80 mm/sec
Grains size of abrasive: SD325 (resin bond)
Width of abrasive: 0.15 mm Example 2

The insulating substrate was produced as Example 1, However, different from Example 1, the through holes were not formed at the time of the molding. Instead, the through holes were formed in the blank substrate by laser processing, after the blank substrate was subjected to rough polishing. The substrate was then subjected to precise polishing.
The condition of the laser processing was as follows.
CO2 laser (wavelength of 10.6 μm)
Pulse (1000 Hz, on time 5 μs)
Laser mask size: 0.3 mm Characteristics of the thus obtained insulating substrate were as follows.
Breakdown voltage: average of measurement 78 kV/mm
Thickness of insulating substrate 1: 150 μm
Diameter W of through hole 2: 70 μm
Purity of alumina: 99.9 percent
Relative density: 99.6 percent
Average grain size: 5 μm
Porosity: 0.4 percent
Resistivity: $10^{14}$ Ω·c m
Distance D between through holes: 500 μm
Number of through holes: 3.2 counts/cm$^2$
Density of pores having a size of 10 μm or larger: 0.0 percent The thus obtained insulating substrate was subjected to same evaluations as Example 1.

Examples 3 to 6

The substrates were produced according to the same procedure as the Example 2, However, the sintering temperature was adjusted to produce the substrates having different average grain sizes. The thus obtained substrates were subjected to the same evaluations as the Example 1.

Comparative Example 1

The insulating substrate was produced according to the procedure described referring to FIG. 3.

| (Powdery raw materials) | |
| --- | --- |
| α-alumina powder (purity of alumina was 99.6%) | 100 mass parts |
| MgO (magnesia) | 100 mass ppm |
| Fe$_2$O$_3$ | 200 mass ppm |

-continued

| | |
|---|---|
| SiO₂ | 150 mass ppm |
| CuO | 100 mass ppm |
| (Dispersing medium) | |
| Dimethyl glutarate | 27 mass parts |
| Ethylene glycol | 0.3 mass parts |
| (Gelling agent) | |
| MDI resin | 4 mass parts |
| (Dispersing agent) | |
| High molecular surfactant | 3 mass parts |
| (Catalyst) | |
| N,N-dimethylaminohexanol | 0.1 mass parts |

The insulating substrate was produced according to the same procedure as Example 1, However, properties and characteristics of alumina sintered body were as follows.
Purity of alumina: 99.6 percent
Average grain size: 1 μm
Relative density: 98 percent
Porosity: 2 percent
Resistivity: $10^{14}$ Ω·c m
Thickness of insulating substrate 1: 150 μm
Diameter W of through hole 2: 70 μm
Distance D between through holes: 500 μm
Number of through holes: 35 counts/cm²
Density of pores having a size of 10 μm or larger: 1 percent The thus obtained insulating substrate was subjected to same evaluations as Example 1, The results were shown in table 1.

Comparative Examples 2 to 6

The substrates were produced according to the same procedure as Example 2, However, it was produced substrates whose alumina purities and average grains sizes are different from each other, by adjusting raw materials for alumina and sintering temperature applied. The thus obtained substrates were subjected to the same evaluation as the Examples 1, The results were shown in table 2.

According to the conditions of the comparative examples, clogging of the abrasives was observed.

TABLE 1

| Examples | 1 | 2 | 3 | 4 | 5 | 6 |
|---|---|---|---|---|---|---|
| Purity of alumina (%) | 99.9 | 99.9 | 99.9 | 99.9 | 99.9 | 99.9 |
| Relative Density (%) | 99.7 | 99.7 | 99.6 | 99.8 | 99.5 | 99.8 |
| Average Grain size (μm) | 5 | 5 | 3.5 | 20 | 2 | 50 |
| Abnormality of Through hole | 0/100 | 0/100 | 0/100 | 0/100 | 3/100 | 0/100 |
| Tipping and cracks after Dicing | 0/10 | 0/10 | 0/10 | 0/10 | 0/10 | 1/10 |

TABLE 2

| Comparative Examples | 1 | 2 | 3 | 4 | 5 |
|---|---|---|---|---|---|
| Purity of Alumina (%) | 99.6 | 99.6 | 99.8 | 99.9 | 99.9 |
| Relative density (%) | 99.3 | 99.4 | 99.4 | 99.5 | 99.8 |
| Average Grain size (μm) | 2 | 5 | 5 | 1 | 55 |
| Abnormality of through holes | 20/100 | 15/100 | 10/100 | 5/100 | 0/100 |
| Tipping or cracks after dicing | 4/10 | 7/10 | 5/10 | 3/10 | 5/10 Crack generation Due to abnormal Crystal growth |

As shown in table 1, according to the present invention, number of the through holes of the abnormal shape was small and the cracks and tipping after the dicing were reduced.

According to the comparative examples 1, 2 and 3, as the relative density of the alumina sintered body forming the insulating substrate was low, many abnormal through holes and cracks and tipping after the dicing were observed. According to the comparative example 4, as the average grains size of the alumina sintered body forming the insulating substrate was small, many abnormal through holes and cracks and tipping after the dicing were observed.

According to the comparative example 5, as the average grain size of the alumina sintered body forming the insulating substrate was large, the number of the cracks and tipping after the dicing were large.

The invetion claimed is:

1. An insulating substrate including through holes for conductors, wherein said through holes are arranged in said insulating substrate and are substantially free of expanded parts:
   wherein a thickness of said insulating substrate is 25 to 300 μm;
   wherein a diameter of said through hole is 20 to 100 μm;
   wherein said insulating substrate comprises an alumina sintered body wherein a purity of alumina of said alumina sintered body is 99.9 percent or higher, and wherein 200 to 800 mass ppm of zirconia, 150 to 300 mass ppm of magnesia and 10 to 30 mass ppm of yttria are added to said alumina sintered body as sintering aids;
   wherein a relative density of said alumina sintered body is 99.5 percent or higher; and
   wherein an average grain size of said alumina sintered body is 2 to 50 μm.

2. The insulating substrate of claim 1, wherein said alumina sintered body has a breakdown voltage of 50 kV/mm or higher.

3. The insulating substrate of claim 1, wherein said through hole is formed by laser processing.

4. The insulating substrate of claim 1, wherein said through hole are formed in molding said alumina sintered body.

* * * * *